United States Patent [19]

Yamaguchi et al.

[11] Patent Number: 4,595,939

[45] Date of Patent: Jun. 17, 1986

[54] RADIATION-CONTROLLABLE THYRISTOR WITH MULTIPLE, NON-CONCENTRIC AMPLIFIED STAGES

[75] Inventors: Yoshihiro Yamaguchi, Urawa; Hiromichi Ohashi, Yokohama, both of Japan

[73] Assignee: Tokyo Shibaura Denki Kabushiki Kaisha, Kawasaki, Japan

[21] Appl. No.: 527,477

[22] Filed: Aug. 29, 1983

[30] Foreign Application Priority Data

Nov. 15, 1982 [JP] Japan .................................. 57-199961
Nov. 15, 1982 [JP] Japan .................................. 57-199962

[51] Int. Cl.$^4$ ............................................. H01L 29/74
[52] U.S. Cl. ........................................ 357/38; 357/20; 357/30; 357/68; 357/86
[58] Field of Search ..................... 357/30, 38, 86, 20, 357/681

[56] References Cited

U.S. PATENT DOCUMENTS

| | | | |
|---|---|---|---|
| 3,590,346 | 6/1971 | Bilo et al. | 357/38 |
| 3,697,833 | 10/1972 | Nakata | 357/38 |
| 3,893,153 | 7/1975 | Page et al. | 357/38 |
| 4,060,826 | 11/1977 | Voss | 357/38 |
| 4,208,669 | 6/1980 | Silber et al. | |
| 4,298,882 | 11/1981 | Homola et al. | 357/38 |

FOREIGN PATENT DOCUMENTS 2739187 10/1981 Fed. Rep. of Germany .

Primary Examiner—Joseph E. Clawson, Jr.
Attorney, Agent, or Firm—Oblon, Fisher, Spivak, McClelland & Maier

[57] ABSTRACT

A radiation-controllable thyristor is disclosed, which includes an electrical trigger main thyristor having four semiconductor layers each having mutually different conductivity types, and a plurality of stages of pilot thyristors commonly having three other layers excluding one emitter layer of the above main thyristor. First-stage one of the pilot thyristors is a light-triggering type thyristor having a photo-sensing area onto which a control radiation, such as light beam, is irradiated. A collector electrode is provided on another emitter layer of the main thryistor in such a way as to substantially surround the above pilot thyristors.

17 Claims, 10 Drawing Figures

F I G. 5
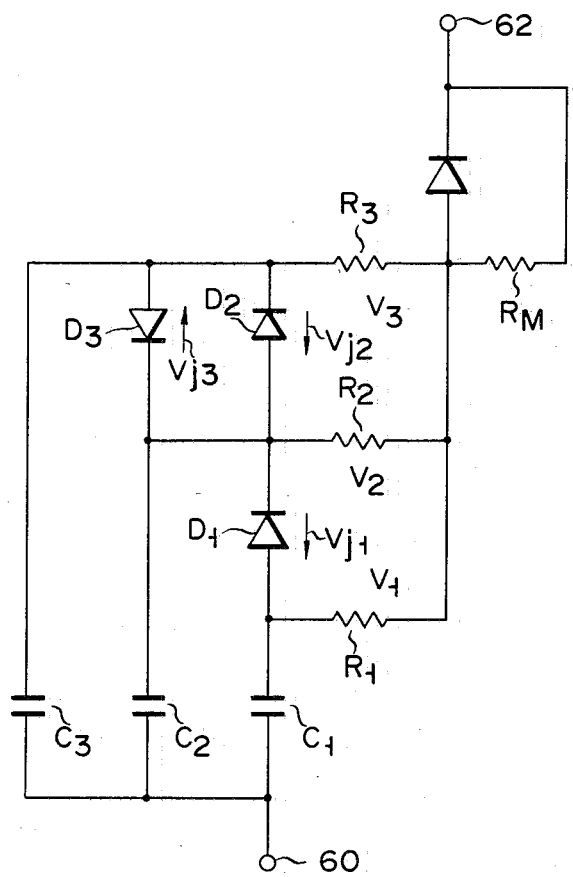

F I G. 10
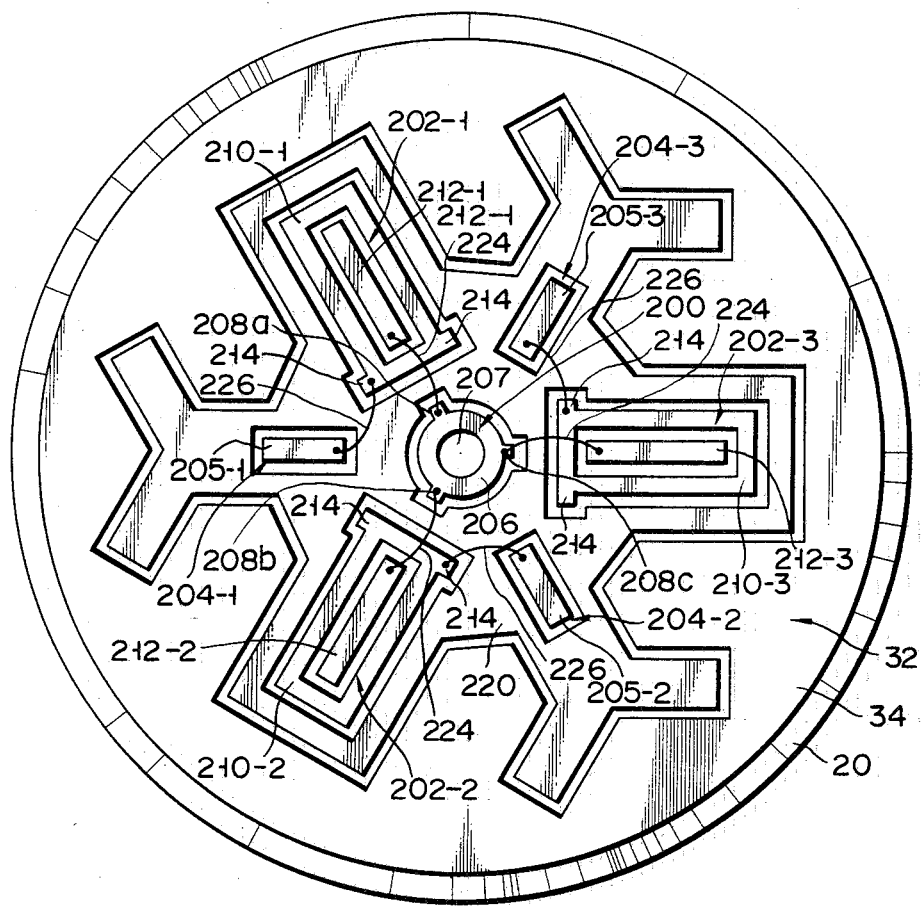

RADIATION-CONTROLLABLE THYRISTOR WITH MULTIPLE, NON-CONCENTRIC AMPLIFIED STAGES

BACKGROUND OF THE INVENTION

The present invention relates generally to a semiconductor rectifier and, more particularly, to a thyristor which is controlled by radiation, such as a light beam.

It is well known that a thyristor valve is preferably utilized as a rectifier which controls power transmission when used in a high power transmission system such as a DC power transmission system or the like. In this regard, persons skilled in the art have urged that the ordinary electrical trigger type thyristor, which controls the start time of conduction by an electrical triggering signal supplied to the gate electrode thereof, should be replaced by a light trigger type thyristor (photo-thyristor), such as a thyristor valve, particularly in the case of a power converting apparatus of the above-mentioned power transmission system. Such a replacement is needed, because the use of a light trigger thyristor in a high-voltage power converting apparatus, in which the capacitance and voltage have tended to increase over the years, allows countermeasures for inductive interference and electrical insulation between a main circuit and a control circuit to be easily taken; thus, it can be expected to realize an extremely small and lightweight power converting apparatus.

However, since the light energy to be used in triggering the photo-thyristor is weaker than the electrical triggering energy, it is necessary to increase the photo-sensitivity of the photo-thyristor itself (e.g., in the order of approximately several ten times larger than the gate sensitivity of the electrical trigger type thyristor) in order to effectively control the operation of the photo-thyristor. An increase in the light gate sensitivity of the photo-thyristor causes the noise-resisting property to become worse, since malfunction will easily occur against the voltage noise having a steep leading waveform to be applied from the main circuit side such as a lightning surge or the like to the photo-thyristor. The critical off-voltage build-up rate at which a malfunction of the thyristor will not occur, even if an overvoltage such as the above-mentioned voltage noise or the like is applied thereto, is called the "dv/dt resistive amount". It has been known that it is possible to improve the dv/dt resistive amount without making the photo-sensitivity of a thyristor worse by reducing the photo-sensitive area of the photo-thyristor and reducing the interference current to be caused in this area. However, reduction of the photo-sensitive area causes the conductive range at the initial time of turn-on in an operating characteristic of the photo-thyristor to decrease; consequently, the resistive amount (which is well known as "di/dt resistive amount" to those skilled in the art) of the photo-thyristor against the on-state current having a steep leading waveform that will be caused at the initial time of turn-on will decrease. Therefore, it is one of the important technical subjects at present to develop a photo-thyristor having a high photo-sensitivity without making principal thyristor characteristics of the dv/dt and di/dt resistive amounts worse.

SUMMARY OF THE INVENTION

It is therefore an object of the present invention to provide a new and improved radiation-controllable thyristor device which can increase photo-sensitivity or gate sensitivity without making the principal thyristor characteristics worse.

A main thyristor of a radiation-controllable thyristor device of the present invention has a plurality of semiconductor layers including four semiconductor layers corresponding to a first emitter layer, first and second base layers and a second emitter layer, which are formed one upon another and are alternately of first and second conductivity types. The second base layer has a first surface region in which the second emitter layer is formed and an exposed second surface region. The main thyristor includes a first conductive layer corresponding to a cathode electrode which is provided on the second emitter layer and with which the second base layer is caused to come into partial contact by partially penetrating the second emitter layer. A plurality of stages of pilot thyristors are provided to commonly have the first emitter layer and the first and second base layers of the main thyristor and to respectively have third emitter layers which are formed in the second surface region of the second base layer and each of which has the same conductivity type as the second emitter layer of the main thyristor.

BRIEF DESCRIPTION OF THE DRAWINGS

The present invention is best understood with reference to the accompanying drawings, in which:

FIG. 5 is a diagram showing an equivalent circuit of the thyristor device of FIG. 3;

FIG. 10 is a plan view (not drawn to scale) schematically illustrating the plan structure of the thyristor device in a modified form of the above embodiment.

DETAILED DESCRIPTION OF THE PREFERRED EMBODIMENTS

Figure 1:
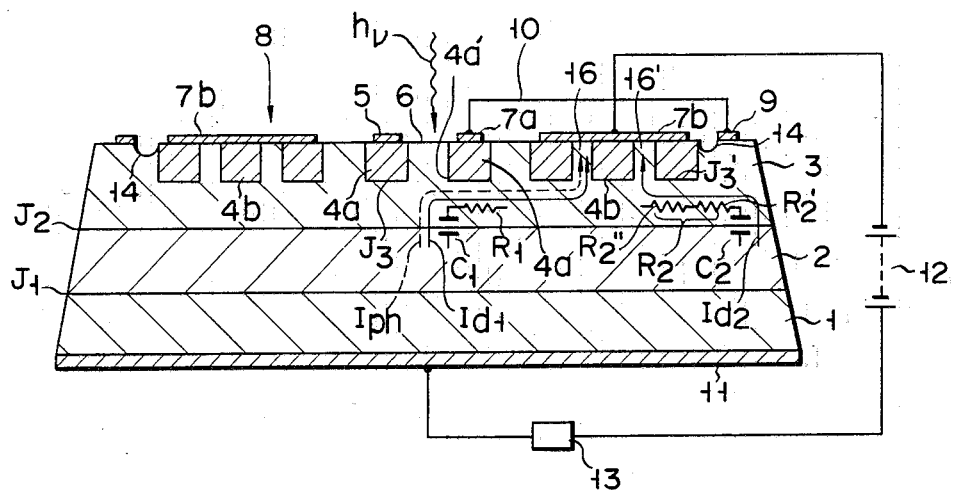
FIG. 1 is a cross-sectional view of a prior art basic light-controllable thyristor device.
Figure 2:
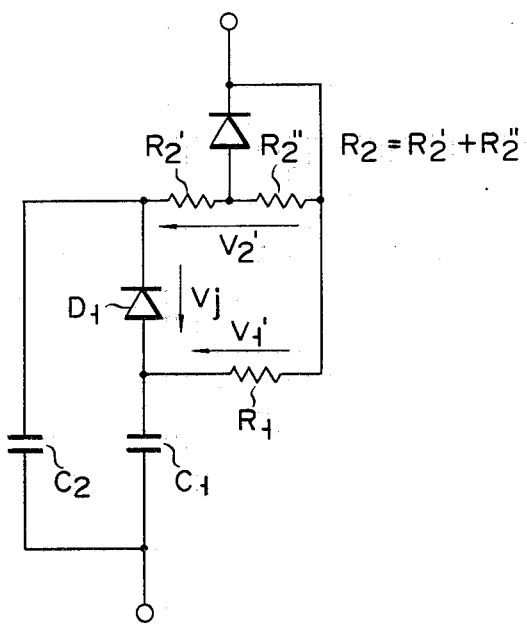
FIG. 2 is a diagram showing an equivalent circuit of the thyristor device of FIG. 1.

Prior to explaining the embodiments of the present invention, a basic photo-thyristor will be described with reference to FIGS. 1 and 2. In the prior art photo-thyristor of FIG. 1, semiconductor layers 1, 2 and 3 respectively correspond to p-type emitter layer, n-type base layer and p-type base layer. A circular ring-like n-type emitter layer 4a is formed in the p-type base layer 3 to provide a pilot thyristor 5. The p-type base layer (p-base layer) 3 is exposed at the central section of the n+-type emitter layer (n+-emitter layer) 4a of this pilot thyristor 5, and this exposed area serves as a photo-receiving section or photo-sensitive section 6. A circular ring-like metal electrode layer 7a is evaporation deposited on the n+-emitter layer 4a.

A main thyristor 8 is formed coaxially with this pilot thyristor 5 in the surface section of the p-base layer 3 around the pilot thyristor 5. Circular ring-like n+-emitter layers 4b are formed in the p-base layer 3. These layers 4b are used for the main thyristor 8 and arranged concentric. They are also concentric with the above-mentioned n+-emitter layer 4a. A metal layer 7b serving as a cathode electrode is so formed as to electrically connect these n+-emitter layers 4b and p-base layer 3. A circular ring-like dv/dt compensating electrode 9 which is connected to the electrode layer 7a through a conductor 10 is formed around the outer circumferential section of the main thyristor 8 on the p-base layer 3. An anode electrode layer 11 made of a metal such as tungsten or the like is formed on the p-emitter layer 1. A DC power source 12 is connected through a load resistor 13 between the electrodes 7b and 11. A reference numeral 14 denotes a ring-like groove formed in the surface section of the p-base layer 3.

When a light triggering signal $h_v$ of a light quantity $\phi$ is radiated onto the photo-sensitive section 6 of the photo-thyristor, a photoelectric current $I_{ph}$ is caused mainly in the depletion layer region on both sides of a central junction $J_2$ between the n-base layer 2 and the p-base layer 3. This current $I_{ph}$ flows in the lateral direction in the p-base layer 3 as shown by the broken line in FIG. 1. The photoelectric current $I_{ph}$ flows through a short-circuit section 16 of the main thyristor 8 and the cathode electrode 7b to an external circuit consisting of the power source 12 and load resistor 13. Assuming that the transverse resistance of the p-base layer 3 through which the photoelectric current $I_{ph}$ flows is represented by a resistor $R_1$ in FIG. 1, a junction $J_3$ between the p-base layer 3 and the n+-emitter layer 4a is biased in the forward direction due to a voltage drop $V_1$ across the resistor $R_1$. When the electric potential at an inner circumferential portion 4a' of the n+-emitter layer 4a where the forward bias is deepest is higher than the diffusion potential at the junction $J_3$, more electrons are injected from the inner circumferential portion 4a' into the p-base layer 3, turning the pilot thyristor 5 on. A turn-on current $I_p$ flows to the external circuit sequentially through the n-emitter layer 4a, electrode layer 7a, conductor 10, electrode layer 9, p-base layer 3, short-circuit section 16, and electrode layer 7b. This current $I_p$ serves as a gate current for the main thyristor 8. The main thyristor 8 is made conductive in response to the current $I_p$. It should be noted that the photo-sensitivity of the light trigger thyristor depends upon the resistor $R_1$, and the photo-sensitivity substantially increases with an increase in resistance of the resistor $R_1$.

In the case where a voltage noise having a steep leading waveform is applied between the anode electrode 11 and the cathode electrode 7b of the prior art light trigger thyristor, an interference current $I_d$ flows over the entire surface area of the junctions $J_1$ and $J_2$ of the thyristor. An interference current component $J_{d1}$ flowing through a junction capacitance $C_1$ of the central junction $J_2$ which locates directly under the photo-sensitive section 6 flows through substantially the same path as the photoelectric current $I_{ph}$ that has been mentioned previously as shown in FIG. 1. An interference current component $I_{d2}$ flowing through a junction capacitance $C_2$ of the circumferential junction just under the dv/dt compensating electrode 9 in the interference current $I_d$, further flows through another short-circuit section 16' of the main thyristor 8. This state may now be described with reference to an equivalent circuit of FIG. 2. A contact potential (barrier potential) drop $V_j$ of a diode $D_1$ consisting of the n-emitter layer 4a of the pilot thyristor 5 and the p-base layer 3 may be expressed as: $V_j = V_1' - V_2'$. $V_1'$ and $V_2'$ denote end-to-end voltages across resistors $R_1$ and $R_2$ of FIG. 1 (wherein, $R_2$ is expressed by two series resistors $R_2'$ and $R_2''$). When the voltage $V_j$ exceeds the diffusion potential (or built-in potential) across the junction $J_3$, the pilot thyristor 3 is dv/dt-triggered. Therefore, in this basic light trigger thyristor, if the resistor $R_2$ is made large to reduce a value of the voltage $V_j$, the pilot thyristor 5 will be difficult to be forwardly biased when a voltage noise is applied, whereby the dv/dt resistive amount of the pilot thyristor 5 can be improved irrespective of the resistor $R_1$.

However, according to a conventional photo-thyristor, there is a problem that an increase in the resistance of the resistor $R_2$ makes the gate sensitivity of the main thyristor 8 large and reduces the dv/dt resistive amount. As may be seen from the equivalent circuit of FIG. 2, the above-mentioned resistor $R_2$ is a sum of the p-base layer resistor $R_2'$ just under the grooved portion 14 of FIG. 1 and the p-base layer resistor $R_2''$ just under the n+-emitter layer 4b of the main thyristor 8. The bias voltage across a junction $J_3'$ formed by the n+-emitter layer 4b and p-base layer 3 is determined by $R_2''$. Therefore, by making the grooved portion 14 deep and $R_2'$ large to increase $R_2$, the photo-sensitivity of the pilot thyristor 5 can be increased without reducing the dv/dt resistive amount of the main thyristor 8. However, since the gate sensitivity of the main thyristor 8 is reduced, the main thyristor 8 will inevitably turned on with some delay time after the pilot thyristor 5 has been turned on. Thus, an on-state current at the initial time of light turning-on is concentrated on the pilot thyristor 5, remarkably reducing the di/dt resistive amount. As described above, in a conventional photo-thyristor, the photo-sensitivity can be improved without loosing the dv/dt or di/dt resistive amount, but to a limited extent. Therefore, according to the prior art photo-thyristor of FIG. 1, it is impossible to accomplish the object of the present invention as described previously.

Figure 3:
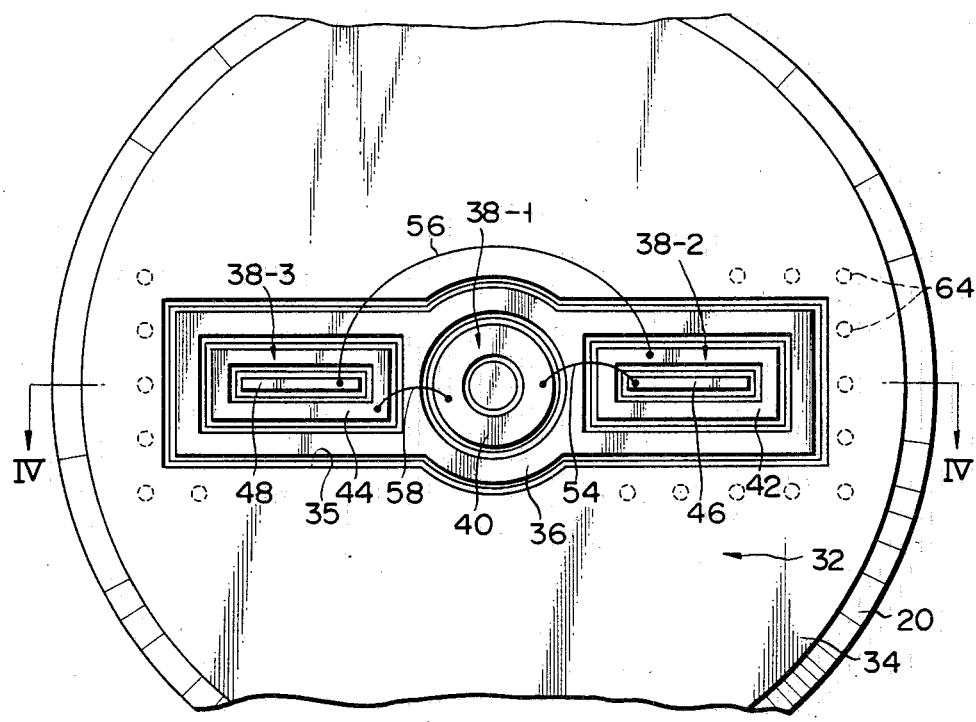
FIG. 3 is a plan view (not drawn to scale for clarity of illustration) of the light-controllable thyristor device which is a first embodiment of the present invention.
Figure 4:
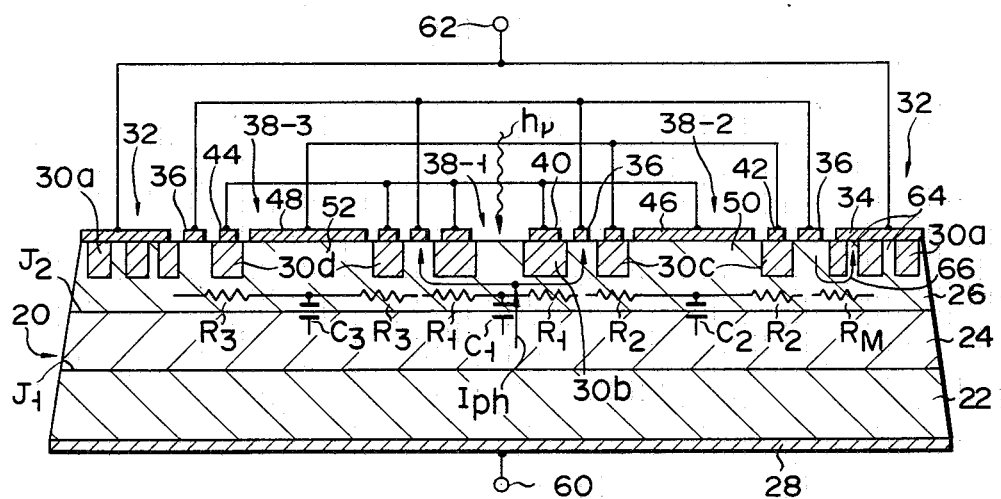
FIG. 4 is a cross-sectional view (not drawn to scale) taken along line IV—IV of the thyristor device of FIG. 3.

Referring now to FIG. 3, a light trigger thyristor is illustrated therein, which is a first embodiment of the present invention. FIG. 4 illustrates a cross-sectional structure taken along line IV—IV of the thyristor of FIG. 3. A substantially circular discoidal semiconductor body 20 is formed by laminating a p-type semiconductor layer 22 serving as an emitter layer (p-emitter layer 22), an n-base layer 24 and a p-base layer 26. An anode electrode layer 28 made of conductive material such as metal is formed on the p-emitter layer 22. A plurality of n+-emitter layers 30a for a main thyristor 32 are formed in the circumferential surface section of the p-base layer 26. The n+-emitter layers 30a are electrically connected to each other by a cathode electrode layer 34 (for the main thyristor 32) formed on the p-base layer 26. As distinctly illustrated in FIG. 1, a substantially rectangular opening 35 is formed in the central section of the cathode layer 34. A collector electrode layer 36, whose plan view is given in FIG. 3, is formed on the p-base layer 26 and in the opening 35 formed in the cathode layer 34. A plurality of (e.g., three) pilot thyristors 38-1, 38-2 and 38-3 are so formed as to be surrounded by the collector electrode 36. The first pilot thyristor 38-1 is a light trigger thyristor having a circular ring-line n+-emitter layer 30b which is formed in the substantially central surface area of the p-base layer 26 and on which an emitter electrode 40 is formed. The p-base layer 26 surrounded by the circular ring-like n+-emitter layer 30b serves as a photosensing section for receiving a light signal $h_\nu$. The second and third pilot thyristors 38-2 and 38-3 which are surrounded by the collector electrode 36 and are located on both sides of the first thyristor 38-1 are electrical trigger thyristors. The n+-emitter layers 30c and 30d for the second and third pilot thyristors 38-2 and 38-3 are respectively formed, independently of each other, in the surface of the p-base layer 26 so as to have a rectangular ring-like shape. Pilot thyristor emitter electrode layers 42 and 44 made of metal are each formed on the n+-emitter layers 30c and 30d. Gate electrode layers 46 and 48 are deposited respectively on rectangular exposed regions 50 and 52 of the p-base layer 26 which are respectively surrounded by the n+-emitter layers 30c and 30d of the second and third pilot thyristors 38-2 and 38-3.

A first conductor wire 54 is provided to electrically connect the ring-like emitter electrode 40 of the light trigger thyristor serving as the first pilot thyristor 38-1 to the gate electrode 46 of the electrical trigger thyristor 38-2 serving as the second pilot thyristor 38-2. A second conductor wire 56 is provided to electrically connect the emitter electrode 42 of the second pilot thyristor 38-2 to the gate electrode 48 of the electrical trigger thyristor 38-3 serving as the third pilot thyristor. Furthermore, the emitter electrode 44 of the third pilot thyristor 38-3 is electrically connected to the emitter electrode 40 of the first pilot thyristor (light trigger thyristor) 38-1 by a third conductor wire 58. Reference numerals 60 and 62 denote anode and cathode terminals, respectively.

FIG. 5 shows an equivalent circuit of the above-described thyristor structure, including transverse equivalent resistors $R_1$, $R_2$, $R_3$ of the p-base layer 26 of the thyristor shown in FIG. 4 and equivalent capacitors $C_1$, $C_2$, $C_3$ to be placed between the p- and n-base layers 26 and 24. In FIG. 5, $D_1$ denotes a diode comprising the n+-emitter layer 30b of the first pilot thyristor 38-1 and the p-base layer 26. $D_2$ and $D_3$ denote diodes which comprise the n+-emitter layers 30c and 30d of the second and third pilot thyristors 38-2 and 38-3 and the p-base layer 26, respectively.

When positive and negative voltages are applied respectively to the anode and cathode terminals 60 and 62 of the light-controllable semiconductor rectifier thus constructed, while radiating a light gate signal $h_{84}$ onto the light trigger thyristor 38-1 serving as the first pilot thyristor, a photoelectric current $I_{ph}$ is produced in the central region (i.e., in the substantially central region of the junction $J_2$ between the n- and p-base layers 24 and 26) of this first pilot thyristor 38-1. As shown in FIG. 4, this photoelectric current $I_{ph}$ flows in the p-base layer 26 in the lateral direction, thereafter it flows through the collector electrode 36 into a short-circuit section 64 located between the p-base layer 26 and the cathode electrode 34 and reaches the cathode electrode 34, as shown by an arrow 66 in FIG. 4. Thus, the photoelectric current $I_{ph}$ causes the voltage drop $V_1$ across the equivalent resistor $R_1$ which exists in the p-base layer 26 in the region of the first pilot thyristor 38-1. This allows the n+-emitter layer 30b of the first pilot thyristor 38-1 to be forwardly biased. As the deepest potential in the above-stated forward bias potential approaches a built-in potential value across the junction $J_2$ between the n+-emitter layer 30b and the p-base layer 26, the quantity of electrons to be injected from the n+-emitter layer 30b into this p-base layer 26 rapidly increases and finally turns on the first pilot thyristor 38-1. The turn-on current of the first pilot thyristor 38-1 then flows through the conductor wire 54 into the gate electrode 46 of the second pilot thyristor (electrical trigger thyristor) 38-2, so that the second pilot thyristor 38-2 is subsequently turned on. The third pilot thyristor 38-3 is also rendered conductive in response to the turning-on operation of this second pilot thyristor 38-2. The turn-on current of the third pilot thyristor 38-3 further flows through the conductor wires 58 and 54 into the gate electrode 46 of the second pilot thyristor 38-2, and thereafter flows through the collector electrode 36 and short-circuit section 64 into the cathode electrode 34. This current serves as a gate control current of the main thyristor 32, and the main thyristor 32 is turned on in response to this current.

In cases wherein an abnormal voltage noise having a voltage waveform (with a large dv/dt value) which rapidly rises is applied between the anode and cathode terminals 60 and 62 of the above-described thyristor device, an interference current flows over almost the entire region of the p-base layer 26. Due to this interference current, potential differences $V_1$, $V_2$ and $V_3$ are respectively caused across each of the equivalent resistors $R_1$, $R_2$ and $R_3$ of the p-base layer 26 in the regions of the pilot thyristors 38-1, 38-2 and 38-3 in the same way as in the case due to the above-described photoelectric current. The voltage $V_2$ caused in the lateral direction in the p-base layer 26 in the area of the second pilot thyristor 38-2 is applied to the n+-emitter layer 30b of the first pilot thyristor 38-1, since this n+-emitter layer 30b is connected to the gate electrode 46 of the second pilot thyristor 38-2 through the emitter electrode 40 and conductor wire 54. Therefore, the bias voltage to be applied to the n+-emitter layer 30b of the first pilot thyristor 38-1 is equal to a differential voltage $V_{j1}$ between the voltages $V_1$ and $V_2$. Because of the similar reason, the bias voltage to be applied to the emitter layer 30c of the second pilot thyristor 38-2 is a differential voltage $V_{j2}$ between the voltages $V_2$ and $V_3$, while the bias voltage to be applied to the n+-emitter layer 30d of the third pilot thyristor 38-3 is a differential voltage $V_{j3}$ between the voltages $V_3$ and $V_2$. In this situation, the dv/dt resistive amounts of the first to third pilot thyristors 38-1, 38-2 and 38-3 are determined by the bias voltages $V_{j1}$, $V_{j2}$ and $V_{j3}$, respectively. When each bias voltage $V_j$ approaches the built-in potential across the p-n junction of each pilot thyristor, the injection of electrons from the n+-emitter layer 30a into the p-base layer 26 is rapidly activated, so that each pilot thyristor is dv/dt turned on. However, each pilot thyristor 38 will not be easily turned on, since the value of each bias voltage $V_j$ is substantially lower than the built-in potential across the junction between the n+-emitter layer of each pilot thyristor 38 and the p-base layer 26. In other words, even when an abnormal voltage having a voltage waveform with a large dv/dt value (having a steep leading waveform) has been applied to the relevant thyristor, the pilot thyristor section is prevented from being easily turned on, thereby preventing a reduction of its dv/dt resistive amount. This effect can be further and satisfactorily accomplished by suitably setting the geometrical patterns of three pilot thyristors 38-1, 38-2, 38-3 and the p-base resistance, so that the voltages $V_1$, $V_2$ and $V_3$ are equal to each other. In this case, since the area of the photosensing section of the light trigger thyristor 38-1 serving as the first pilot thyristor can easily be increased, as compared to a conventional one, the gate sensitivity of the pilot thyristor can also be improved.

According to the present invention, it is possible to increase the gate sensitivity of each pilot thyristor without reducing the dv/dt resistive amount; and, moreover, the diameter of the photosensing section can be increased by 2 to 3 times that of a conventional one. Consequently, the gate sensitivities of the second and third pilot thyristors can be increased, resulting in reduction of concentration of the current to the first pilot thyristor, so that the di/dt resistive amount is increased. The photo-coupling efficiency of the photosensing section with a light transmission system is improved, reducing a driving current of the light emitting diode. Furthermore, this means that a remarkable improvement in photo-sensitivity is accomplished, assuming that the dv/dt resistive amounts are equivalent.

Figure 6:
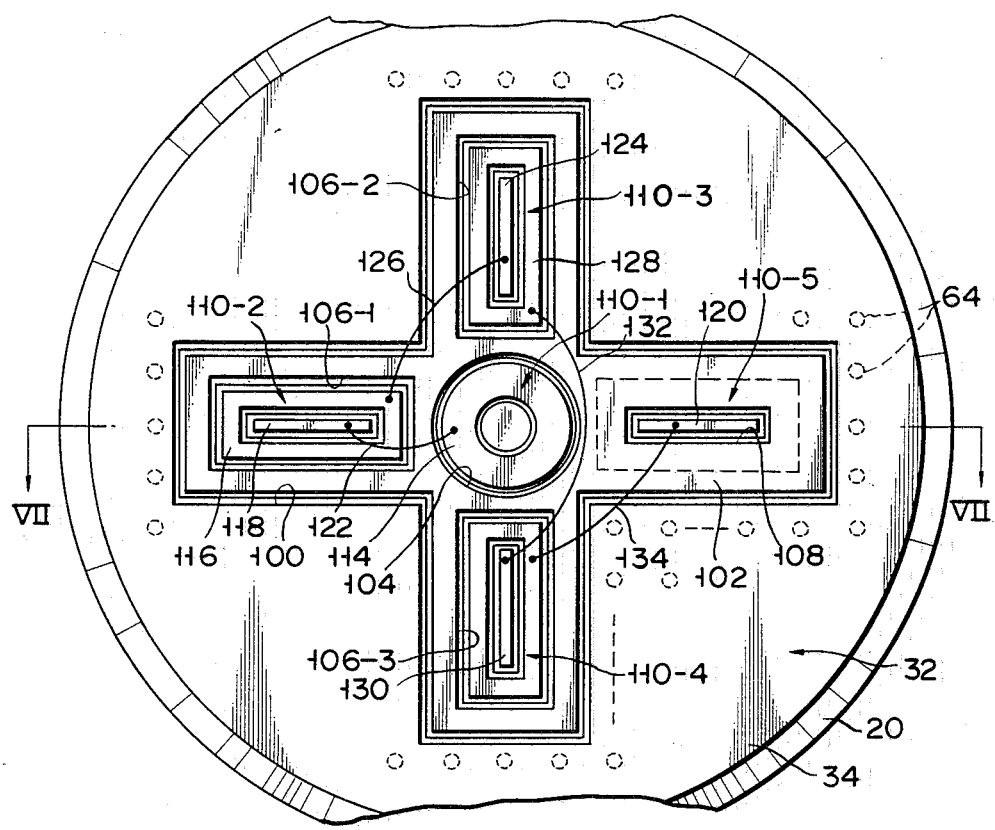
FIG. 6 is a plan view (not drawn to scale) of the light-controllable thyristor device which is a second embodiment of the present invention.
Figure 7:
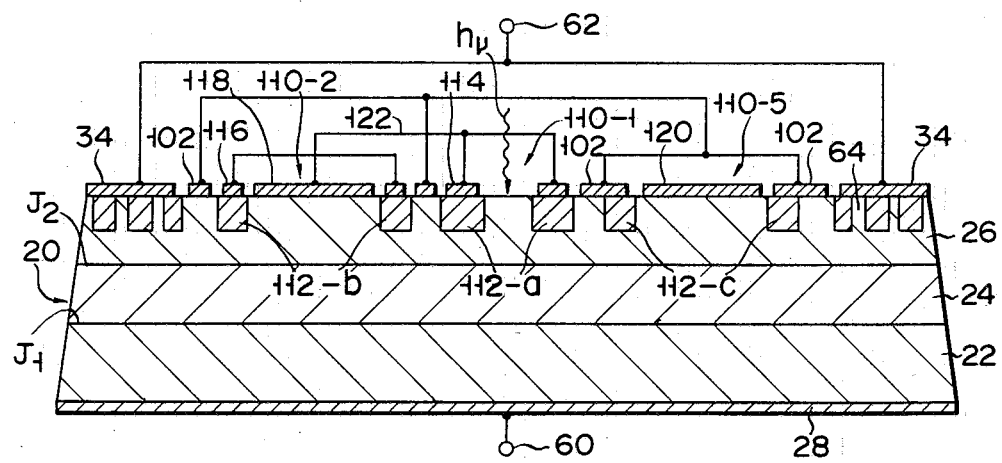
FIG. 7 is a cross-sectional view (not drawn to scale) taken along line VII—VII of the thyristor device of FIG. 6.

Referring to FIGS. 6 and 7, a light-controllable semiconductor rectifier or thyristor device is illustrated therein which is a second embodiment of the present invention. In FIGS. 6 and 7, the same elements and components as those in the first embodiment (which has already been described with reference to FIGS. 3 and 4) are designated by the same reference numerals, and will not be described any further for the sake of simplicity.

As distinctly illustrated in FIG. 6, the cathode electrode layer 34 (for the main thyristor 32) formed on the p-base layer 26 of the semiconductor body 20 has a cross-shaped or X-shaped opening 100. A collector electrode layer 102 having a cross or X-shape is formed in this opening 100 and on the p-base layer 26. This collector electrode 102 is spaced apart from the cross-shaped opening 100 of the cathode layer 34. The collector electrode 102 has a circular opening 104 at its central region and rectangular openings 106-1, 106-2, 106-3, and 108 at its four extending sections of the cross shape. The rectangular opening 108 is smaller than the other three openings 106. Five pilot thyristors 110-1, 110-2, 110-3, 110-4 and 110-5 are formed on the p-base layer 26 so as to be surrounded by this collector electrode 102. Namely, the light trigger thyristor 110-1 serving as the first pilot thyristor is formed on the section of the circular opening 104 of the collector electrode 102. The electrical trigger thyristors 110-2, 110-3 and 110-4 serving as the second to fourth pilot thyristors are formed on three openings 106-1, 106-2 and 106-3 of the collector electrode 102, respectively. The electrical trigger thyristor 110-5 serving as the fifth pilot thyristor is formed on the opening 108 of the collector electrode 102.

FIG. 7 illustrates a cross-sectional structure taken along line VII—VII of the thyristor device of FIG. 6. The first pilot thyristor 110-1 has a circular ring-like n+-emitter layer 112-a in the surface section of the p-base layer 26 in the circular opening 104, with an emitter electrode 114 being formed on this n+-emitter layer 112-a. The section surrounded by the circular ring-like n+-emitter layer 112-a of the p-base layer 26 corresponds to a photosensing section of the light trigger thyristor. The second pilot thyristor 110-2 includes a rectangular ring-like n+-emitter layer 112-b formed in the p-base layer 26, a rectangular ring-like emitter electrode layer 116 formed on this n+-emitter layer 112-b, and a gate electrode layer 118 formed on the region surrounded by the n+-emitter layer 112-b in the p-base layer 26. The third and fourth pilot thyristors 110-3 and 110-4 also have the structures similar to the second pilot thyristor 110-2. The electrical trigger thyristor 110-5 serving as the fifth pilot thyristor includes an n+-emitter layer 112-c having substantially the same size as the n+-emitter layer (112-b) of each of the second to fourth pilot thyristors 110-2, 110-3, 110-4, and a gate electrode layer 120 formed on the region of the p-base layer 26 surrounded by this n+-emitter layer 112-c. It should be noted that the emitter electrode of this fifth pilot thyristor 110-5 is integrally formed with the collector electrode 102 and is commonly used.

A conductor wire 122 (such as an Al or Pt wire) is provided to connect the emitter electrode 114 of the first pilot thyristor 110-1 to the gate electrode 118 of the second pilot thyristor 110-2. The emitter electrode 116 of this second pilot thyristor 110-2 is connected to a gate electrode 124 of the third pilot thyristor 110-3 through a conductor wire 126. An emitter electrode 128 of this third pilot thyristor 110-3 is connected to a gate electrode 130 of the fourth pilot thyristor 110-4 by a conductor wire 132. The emitter electrode of this fourth thyristor 110-4 is connected with the gate electrode 120 of the fifth thyristor 110-5 through a conductor wire 134. As a result of such wiring connections, the first to fifth pilot thyristors 110 are connected substantially in series, as may be seen from the equivalent circuit shown in FIG. 8, and each gate electrode of the second to fifth pilot thyristors 110-2, 110-3, 110-4 and 110-5 is sequentially and electrically connected to the emitter electrode of the pilot thyristor (first to fourth pilot thyristors) at the former stage. Thus, the pilot thyristors 110-2, 110-3, 110-4 and 110-5 at each stage receive the turn-on currents of the pilot thyristors 110-1, 110-2, 110-3 and 110-4 at the respective former stages as gate control currents. They sequentially become conductive or are turned on in response to these gate currents.

Figure 8:
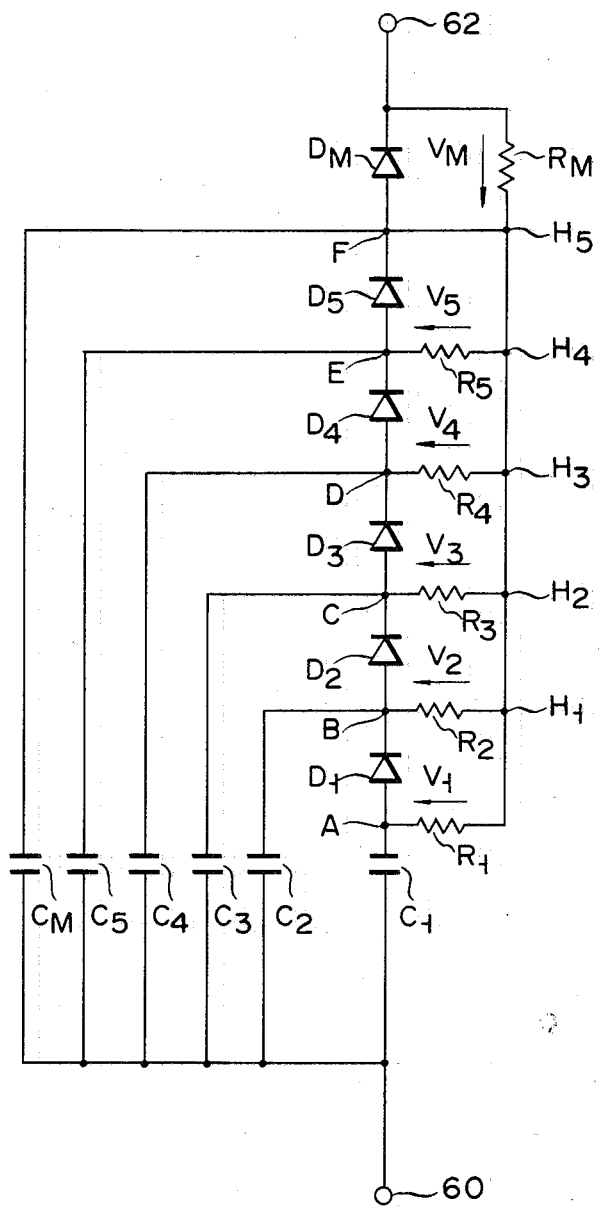
FIG. 8 is a diagram showing an equivalent circuit of the thyristor device of FIG. 6.

In the equivalent circuit of FIG. 8, $R_1$ through $R_5$ represent resistance components which extend in the lateral direction in the p-base layer 26 in the region of each of the first to fifth pilot thyristors 110, respectively. $C_1$ through $C_5$ designate capacitance components which exist in the section between the p- and n-base layers included in the region of each of the first to fifth pilot thyristors 110, respectively. $D_1$ through $D_5$ denote diode components formed due to the p-n junction in the region of each of the first to fifth pilot thyristors 110, respectively. $C_M$ and $D_M$ show capacitance and resistance components in the region of the main thyristor 32, respectively, in the same manner as the case of the first embodiment that has been already described. The capacitance $C_M$ serves to feed an interference current flowing into the short-circuit section 64 of the main thyristor 32. In this drawing, a represents a photosensing section and B to F indicate pilot thyristor gate electrodes, respectively. $H_1$ through $H_5$ correspond to collector electrodes 102.

When a light gate signal $h_v$ is radiated onto the light trigger thyristor 110-1 serving as the first pilot thyristor of the thyristor device constructed in such a manner as described above, a photoelectric current $I_{ph}$ produced as a result of this light irradiation flows from the p-base layer 26, through the collector electrode 102 and short-circuit section 64, sequentially into the cathode electrode 34 in the same way as in the case of the first embodiment previously explained. Due to this photoelectric current $I_{ph}$, the voltage drop $V_1$ occurs across the equivalent resistor $R_1$ of the p-base layer 26 in the area of the first pilot thyristor 110-1 (refer to FIG. 8). The $n^+$-emitter layer 112-a of the first pilot thyristor 110-1 is biased forwardly due to this voltage $V_1$. When the deepest potential in the forward bias voltage approaches the diffusion potential value across the junction between the $n^+$-emitter layer 112-a and the p-base layer 26, the injection of electrons from the $n^+$-emitter layer 112-a into the p-base layer 26 rapidly increases, thereby turning on the first pilot thyristor 110-1. The turn-on current of this first pilot thyristor 110-1 is supplied, as a gate control current, through the wire 122 to the gate electrode 118 of the second pilot thyristor (electrical trigger thyristor) 110-2, so that the second pilot thyristor is also subsequently turned on. The third to fifth pilot thyristors 110-3, 110-4 and 110-5 are also sequentially turned on in response to this action, in the same manner as described above. The turn-on current of the fifth pilot thyristor 110-5 at the final-stage flows through the collector electrode 102 and short-circuit section 64 into the cathode electrode 34. Since this turn-on current serves as a gate control current for the main thyristor 32, the main thyristor 32 is finally turned on in response to this.

Figure 9:
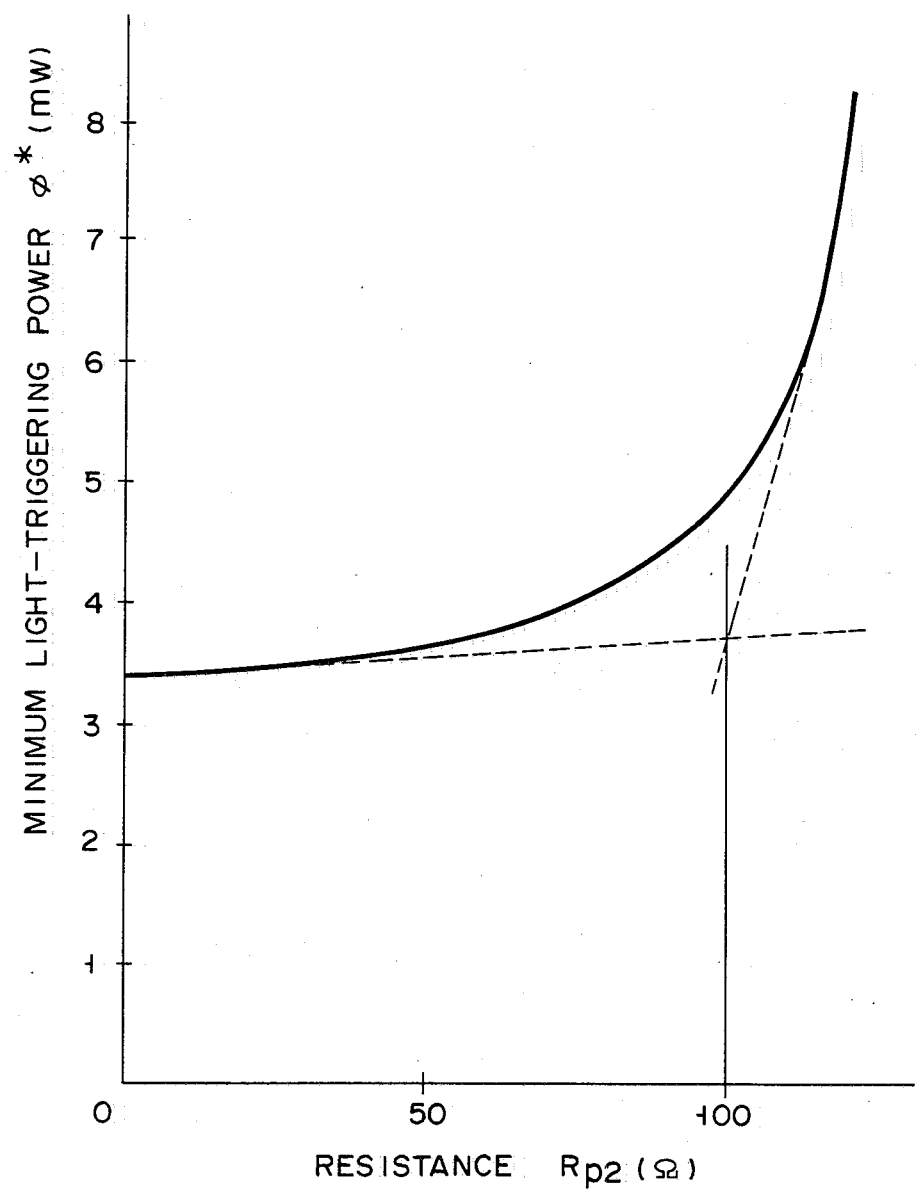
FIG. 9 is a diagram of a characteristic graph showing a mutual relationship between the minimum light-triggering power $\phi^*$ of the light trigger thyristor which is a first pilot thyristor of the thyristor device of FIG. 6, and a resistance $R_{p2}$ between a collector electrode and the gate electrode of the electrical trigger thyristor which is a second trigger thyristor.

According to the present invention, to improve the photo-sensitivity (gate sensitivity) of a thyristor, the lateral resistor $R_1$ of the p-base layer 26 directly under the $n^+$-emitter layer 112-a of the first pilot thyristor 110-1 is increased, and, at the same time, the resistance value $R_p$ (which may be expressed by $R_{p2}$ in accordance with the second pilot thyristor) between the gate electrode 118 of the second pilot thyristor 110-2 and the collector electrode 34 is so set as to be decreased. FIG. 9 shows a relationship between the minimum light-triggering power $\phi^*$ of the first pilot thyristor 110-1 and the above-mentioned resistance value $R_{p2}$, and is a characteristic diagram on the basis of the data obtained by experiments performed by the present inventors. As may be seen from the graph of FIG. 9, when the resistance value $R_{p2} > 100$ ohms ($\Omega$), the minimum light-triggering power $\phi^*$ rapidly increases and the photo-sensitivity reduces. This is because a part of the photoelectric current $I_{ph}$ flows into the collector electrode 102 through the $n^+$-emitter layer 112-a, wire 122, gate electrode 118 of the second pilot thyristor 110-2, and the p-base layer 26 just under the $n^+$-emitter layer 112-b, so that the voltage to reversely bias the $n^+$-emitter layer 112-b of the second pilot thyristor occurs between this collector electrode 102 and the gate electrode 118. It is, therefore, possible to improve the photo-sensitivity by making the resistance value $R_{p2}$ small and by reducing the reverse bias voltage to be applied to the $n^+$-emitter layer 112-b due to this.

The cases wherein an abnormal voltage is applied between the anode-cathode portion of this thyristor device may now be described with reference to the equivalent circuit of FIG. 8. Assuming that the density of current flowing through each of the junction capacitances $C_1$ to $C_5$ and $C_M$ is $J_d$, the voltages $V_1$ to $V_5$ to be respectively caused across the resistors $R_1$ to $R_5$, in association with occurrence of the interference current due to the abnormal voltage applied, are substantially proportional to the current density $J_d$. Hence, this resistance component may be represented by the following equation:

$$R_i = V_i/J_d \text{ (wherein } i=1, 2, \ldots, 5) \tag{1}$$

The maximum values of the forward bias voltages $V_{12}$, $V_{23}$, $V_{34}$, $V_{45}$ and $V_5$ of the first to fifth pilot thyristors 110 are equal to the voltages across the diodes $D_1$ to $D_5$ (FIG. 6), respectively. The above bias voltages $V_{12}$, $V_{23}$, $V_{34}$, $V_{45}$, $V_5$ are respectively expressed by the following equations:

$$V_{12} = V_1 - V_2 = (R_1 - R_2) \cdot C_j dv/dt \tag{2}$$

$$V_{23} = V_2 - V_3 = (R_2 - R_3) \cdot C_j dv/dt \tag{3}$$

$$V_{34} = V_3 - V_4 = (R_3 - R_4) \cdot C_j dv/dt \tag{4}$$

$$V_{45} = V_4 - V_5 = (R_4 - R_5) \cdot C_j dv/dt \tag{5}$$

$$V_5 = R_5 \cdot C_j dv/dt \tag{6}$$

(wherein, $C_j \cdot dv/dt = J_d$, and $C_j$: junction capacitance).

When the values of $V_{12}$, $V_{23}$, $V_{34}$, $V_{45}$ and $V_5$ attain the level of the diffusion potentials of each of the diodes $D_1$ through $D_5$, the junction of electrons from the pilot thyristor rapidly increases; and the pilot thyristor, of which the bias voltage has first exceeded the diffusion potential, triggers at a rate of dv/dt. In the second embodiment, the values of $R_1$ to $R_5$ are selected so that the values of $V_{12}$, $V_{23}$, $V_{34}$ and $V_{45}$ are smaller than $V_5$, or are equal thereto. When $V_{12}$, $V_{23}$, $V_{34}$ and $V_{45}$ were so designed as to be equal to $V_5$, we obtain the following equation: $R_5 = R_4 - R_5 = R_3 - R_4 = R_2 - R_3 = R_1 - R_2$. From these relationships, the relationship of $R_5 = R_4/2 = R_3/3 = R_2/4 = R_1/5$ is obtained. Therefore, to satisfy the above-mentioned condition, the values of $R_1$ to $R_5$ must be selected so as to satisfy at least the relations: $R_5 \geq R_4/2$, $R_5 \geq R_3/3$, $R_5 \geq R_2/4$, and $R_5 \geq R_1/5$.

In the present invention, as described above, it is necessary to prevent the reduction of photo-sensitivity by setting the resistance value between the gate electrode 118 of the second pilot thyristor 110-2 and the collector electrode 102 at the level of 100 ohms or less. $R_2$ depends upon the width of the $n^+$-emitter layer of the second pilot thyristor 110-2, on the other hand, the resistance value between the gate electrode 118 and the collector electrode 102 can be reduced by making the length of the $n^+$-emitter layer large. Thus, it is possible to realize the conditions of $R_1$ to $R_5$ and the conditions of the resistance values between the collector electrode 102 and the gate electrode 118, as stated above, without any mutual contradiction.

On the other hand, with such a construction, the dv/dt resistive amount is determined by the p-base effective resistance $R_n$ of the pilot thyristor 110-5 at the final-stage. As shown in the present embodiment, when the pilot thyristors are constituted by five stages, $R_5$ may be determined so as to satisfy a dv/dt value of predetermined specifications. At that time, $R_1$ can be increased up to five times larger than $R_5$. If one desires to increase the diameter of the photosensing section to improve the photo-sensitivity of the first pilot thyristor 110-1 where the photo-sensing section exists and improve the photo-coupling efficiency with the photo-signal transmission system, it is generally necessary to make $R_1$ large. According to the present invention, however, $R_1$ can easily be increased without sacrificing the dv/dt resistive amount, so that the photo-sensitivity and photo-coupling efficiency can be greatly improved. For example, in accordance with the experiment using the light trigger thyristor of 4 kV, when the diameter d of the photosensing section of the light trigger thyristor 110-1 serving as the first pilot thyristor equals 1.5 mm$\phi$, dv/dt=1,500 V/$\mu$s and minimum light-triggering power $\phi^*$=4 mw, in a prior art example. However, in the light trigger thyristor of the 5-stage pilot thyristor according to the present invention, a result wherein $\phi^*$=2 mw could be derived. In addition, for the sake of comparison, when the present invention was applied under the same conditions wherein $\phi^*$=4 mw, the diameter of the photosensing section could be doubly improved, as compared to a conventional device i.e. the relationship wherein d=3 mm$\phi$ applied. For comparison of the photo-signal transmission system consisting of bundle type optical fibers of 1.5 mm$\phi$ to that wherein the optical fibers are 3 mm$\phi$, in the case wherein a light emitting diode is used as a light source, it is possible to improve the light emitting output of the light emitting diode and the photo-coupling efficiency of the bundle type optical fiber three fold or more. In every case, the driving current of the light emitting diode can be remarkably improved. Since the driving current value of a light emitting diode largely affects a life of the light emitting diode, reliability of the light trigger system can be greatly improved by performing the present invention. The light trigger thyristor according to the present invention is remarkably effective, especially when installed in a thyristor valve used in transmitting a DC power source or the like, which requires a high degree of reliability for the light trigger system. When the diameter of the photosensing section is enlarged, there are generally tendencies to increase a leakage current produced in this section and to reduce the voltage resistibility at high temperatures. However, since the leakage current flows along the same path as an interference current, the thyristor for which the present invention was developed is also effective in preventing erroneous triggering due to the leakage current. Thus, it is possible to realize the thyristor having excellent forward stopping voltage characteristics at high temperatures.

Furthermore, according to the present invention, such effects presented below are obtained owing to the collector electrodes. As illustrated in FIG. 2, in the prior art example, R$_1$ and R$_2$ are electrically coupled through the cathode electrode and the voltage caused across R$_1$ due to the interference current is set off by the voltage caused across R$_2$, thereby improving the dv/dt resistive amount. However, as described previously, if one tries to prevent reduction of the dv/dt resistive amount of the main thyristor, the di/dt resistive amount is unavoidably reduced. On the contrary, according to the present invention, since R$_1$ to R$_5$ and R$_M$ are electrically coupled through the collector electrode 102, the number of stages of the pilot thyristors can be easily increased. The current flows through the first pilot thyristor 110-1, where the photosensing section exists at the initial time of turning on, and is reduced in proportion to the number of pilot thyristors at the rear stages. Therefore, the thyristor according to the present invention can reduce concentration of the turn-on current at the first pilot thyristor 110-1. In addition, for the thyristor according to the present invention, the area of the photosensing section can be easily increased without sacrificing the photo-sensitivity and dv/dt resistive amount. Consequently, the initial turn-on region is enlarged and the on-state current density at the initial time of turning on can be remarkably reduced. For such reasons, the present invention can greatly increase the di/dt resistive amount, as compared to a conventional device. In accordance with the results obtained by a thyristor device made on an experimental basis, the thyristor of the present embodiment could realize a di/dt resistive amount of (di/dt$\geq$600 A), which is 2 to 3 times better than that of a conventional thyristor.

As described above, with the present embodiments, it is possible to realize a thyristor which has a high level of performance and high applicability for practical use, and which allows the di/dt resistive amount and photo-sensitivity (gate sensitivity) to be remarkably improved without adversely affecting essential characteristics, such as the dv/dt resistive amount or the like.

FIG. 10 shows a plan view of the thyristor device, which is an example of the modified form of the above embodiments (the boundary lines of the p-n junctions which can be seen between the various electrode layers having been omitted for the sake of clarity in the drawing). This thyristor device includes a first pilot thyristor 200 consisting of a light trigger thyristor, a second pilot thyristor consisting of three electrical trigger thyristors 202-1, 202-2, 202-3, and a third pilot thyristor consisting similarly of three electrical trigger thyristors 204-1, 204-2, 204-3. A ring-like emitter electrode 206 of the first pilot thyristor 200 is so formed as to have a photo-sensing section 207 at the central section of the p-base layer 26 (FIG. 4 or 7) of the semiconductor body 20. This emitter electrode 206 has at its peripheral portion three projecting portions 208a, 208b and 208c which extend radially and are spaced apart from each other at equal angles (i.e., at angles of 120°). Three electrical trigger thyristors 202-1, 202-2 and 202-3, which constitute the second pilot thyristor, are formed in the extending directions of these three projecting emitter electrode portions 208a, 208b and 208c. These electrical trigger thyristors respectively include emitter electrode layers 210-1, 210-2 and 210-3 each having the substantially rectangular ring-like flat shape, and gate electrodes 212-1, 212-2 and 212-3 formed on the surfaces of the p-base layer 26 (refer to FIG. 4 or 7) so as to be enclosed in these layers 210. Since the n$^+$-emitter layer of each of these thyristors 210 is constituted substantially in the same manner as in the cases of the aforementioned embodiments, its description and drawing are omitted for the sake of simplicity. Three electrical trigger thyristors 204, each having gate electrodes 205-1, 205-2 and 205-3 constituting the third pilot thyristor section, are arranged at locations corresponding to the directions opposite to the extending directions of the three projecting portions 208a, 208b and 208c formed in the circular ring-like emitter layer 206 of the above-mentioned first pilot thyristor 200. In FIG. 10, the pilot thyristor located between the pilot thyristors 202-1 and 202-2 is numbered 204-1, and the other similar pilot thyristors are sequentially numbered 204-2 and 204-3 proceeding counterclockwise. It should be noted that each of the above-mentioned three emitter electrodes 210-1, 210-2 and 210-3 has projecting portions 214 for bonding with wires at the edge portions close to the ring-like emitter electrode 206 of the first pilot thyristor 200.

A collector electrode 220 is provided on the p-base layer 26 of the semiconductor body 20 in such a manner as to surround the pilot thyristors 200, 202 and 204. As illustrated in FIG. 10, this collector electrode 220 has three edge portions each of which branches in two directions at the locations corresponding to three pilot thyristors 204-1, 204-2 and 204-3. This collector electrode 220 serves as the common emitter electrodes for three thyristors 204 constituting the third pilot thyristor in the same manner as in the second embodiment shown in FIG. 6. The cathode electrode 34 for the main thyristor 32 is so provided as to surround the collector electrode 220 having the special shape on the p-base layer 26.

Three conductor wires (e.g., aluminum wires) 224 are respectively wire-bonded, by using a well-known wiring technology, between the emitter electrode projecting portions 208a, 208b, 208c of the first pilot thyristor and the gate electrodes 212-1, 212-2, 212-3 of three pilot thyristors 202-1, 202-2, 202-3 which are included in the second pilot thyristor 202. At the same time, three conductor wires 226 are respectively bonded between the projecting portions 214 of the emitter electrodes 210-1, 210-2, 210-3 of the three electrical trigger thyristors 202-1, 202-2, 202-3 of second pilot thyristor and the gate electrodes 205-1, 205-2, 205-3 of the three electrical trigger thyristors 204-1, 204-2, 204-3 which are included in the third pilot thyristor 204.

The pilot thyristor components 200, 202, 204 and the main thyristor 32 are formed on the <1 1 1> surface of a silicon wafer 20. The peripheral longitudinal directions of the n+-emitter electrodes and collector electrodes 40 of each pilot thyristor are arranged in the directions of [0 1 $\bar{1}$], [0 $\bar{1}$1], [$\bar{1}$1 0], [1 $\bar{1}$0], [1 0 $\bar{1}$] and [$\bar{1}$ 1] of the crystallographic axis. Half of the peripheral lengths of each n+-emitter electrode and collector electrode 40 are faced in the directions of [0 $\bar{1}$1], [1 $\bar{1}$0] and [1 0 $\bar{1}$] of the crystallographic axis, and the crystallographic axis in these directions are suitable for maintaining the conducting region at the initial time of turning on, thereby ensuring the turn-on operation. As a result, according to this modified form example, not only the above-described effect is attained but it is also possible to improve the operating characteristics. In addition, the lengths of the conductor wires to connect between the respective pilot thyristors can be shortened as compared with the foregoing embodiments, thereby improving the reliability of the device.

Although the present invention has been shown and described with respect to particular embodiments, various changes and modifications which are obvious to a person skilled in the art to which the invention pertains are deemed to lie within the spirit and scope of the invention. In the above-described embodiments, an example of the photo-thyristor has been shown. However, the present invention may be similarly applied to an electrical trigger thyristor consisting of a gate electrode formed in the photosensing section 27. Furthermore, the shapes and arrangement of the pilot thyristors may be determined in accordance with certain specifications. In the last analysis, a plurality of pilot thyristors may be arranged in such a manner as to be surrounded by the collector electrode formed on the p-base layer, thereby sequentially and electrically connecting the mutual n+-emitter electrode to the gate electrode of each pilot thyristor.

What is claimed is:

1. A radiation-controllable semiconductor rectifier comprising:
    (a) a main thyristor which is formed of an electrical trigger thyristor having four semiconductor layers with mutually different conductivity types corresponding to a first emitter layer, first and second base layers and a second emitter layer, and which adjusts transmission of an electrical power; and
    (b) control means for receiving a control radiation such as light and for controlling the operation of said main thyristor in response to said radiation, said control means comprising,
        (i) a first-stage pilot thyristor formed of a radiation trigger thyristor having an emitter electrode and a radiation sensitive area to receive said radiation,
        (ii) a plurality of pilot thyristors non-concentrically formed with respect to each other and said first-stage pilot thyristor to provide second- and final-stage pilot thyristors formed of electrical trigger thyristors each having emitter electrodes and gate electrodes, said electrical trigger pilot thyristors being serially connected so that each succeeding pilot thyristor stage is ignitable or turned on in response to turning on of the preceding pilot thyristor stage,
        (iii) a collector electrode layer formed on said second base layer of said four semiconductor layers so as to surround pilot thyristors,
        (iv) first conductive wire means for electrically connecting said emitter electrode of said first-stage radiation trigger pilot thyristor both to the gate electrode of said second-stage electrical trigger thyristor and to the emitter electrode of said final-stage electrical trigger thyristor, and
        (v) second conductive wire means for sequentially and electrically connecting the emitter electrode of each of said electrical trigger thyristors to the gate electrode of the thyristor at the next stage of each of said thyristors.

2. A rectifier according to claim 1, wherein said main thyristor includes:
    a first semiconductor layer which has a first conductivity type and corresponds to a first emitter of said main thyristor and to which an anode electrode of said main thyristor is connected;
    a second semiconductor layer which is laminated on said first layer and has a second conductivity type and corresponds to a first base of said main thyristor;
    a third semiconductor layer which is laminated on said second layer to have the first conductivity type and corresponds to a second base of the main thyristor, said third layer having first and second surface regions; and
    a fourth semiconductor layer which is formed in the first surface region of said third layer and has the second conductivity type and to which a cathode electrode of said main thyristor is connected.

3. A rectifier according to claim 2, wherein the emitter electrodes of said pilot thyristors are respectively constituted by fifth semiconductor layers of the second conductivity type, which are embedded and formed so as to be closed-loop shaped in said third layer in said second surface region of said third layer; and wherein said collector electrode is formed on said second surface region of said third layer.

4. A rectifier according to claim 3, wherein said third layer extends and exists by penetrating through said fourth layer, thereby being electrically and partially connected to said electrode of said main thyristor.

5. A radiation-controllable semiconductor rectifier comprising:
  (a) a main thyristor which is formed of an electrical trigger thyristor having four semiconductor layers with mutually different conductivity types corresponding to a first emitter layer, first and second base layers and a second emitter layer, and adjusting the transmission of an electrical power;
  (b) control means for receiving a control radiation such as light and for controlling the operation of said main thyristor in response to said radiation, said control means comprising,
    (i) a first-stage pilot thyristor comprising a radiation trigger thyristor having an emitter electrode and a radiation sensitive area to receive said radiation,
    (ii) a plurality of pilot thyristors non-concentrically formed with respect to each other and said first-stage pilot thyristor to provide second-and final-stage pilot thyristors in the form of electrical trigger thyristor having emitter electrode and gate electrode, each of said electrical trigger pilot thyristor serially connected so that each succeeding pilot thyristor stage is ignitable or turned on in response to turning on of the preceding pilot thyristor stage,
    (iii) a collector electrode layer formed on said second base layer of said four semiconductor layers so as to surround said pilot thyristors and so as to be electrically connected with said emitter electrode of said final-stage electrical trigger pilot thyristor,
    (iv) first conductive wire means for electrically connecting the emitter electrode of said first-stage radiation trigger thyristor to the gate electrode of said second-stage electrical trigger thyristor, and
    (v) second conductive wire means for electrically and sequentially connecting the emitter electrode of each of said plurality of electrical trigger thyristors which contain said second-stage electrical trigger thyristor to the gate electrode of the electrical trigger pilot thyristor provided at the next stage of itself including the final-stage pilot thyristor.

6. A rectifier according to claim 5, wherein said main thyristor includes:
  a first semiconductor layer which has a first conductivity type and corresponds to a first emitter of said main thyristor and to which an anode electrode of said main thyristor is connected;
  a second semiconductor layer which is laminated on said layer and has a second conductivity type and corresponds to a first base of said main thyristor;
  a third semiconductor layer which is laminated on said second layer to have the first conductivity type and corresponds to a second base of the main thyristor, said third layer having first and second surface regions; and
  a fourth semiconductor layer which is formed in the first surface region of said third layer and has the second conductivity type and to which a cathode electrode of said main thyristor is connected.

7. A rectifier according to claim 6, wherein the emitter electrodes of said pilot thyristors are respectively constituted by fifth semiconductor layers of the second conductivity type, which are embedded and formed so as to be closed-loop shaped in said third layer in said second surface region of said third layer; and wherein said collector electrode is formed on said second surface region of said third layer.

8. A rectifier according to claim 7, wherein said third layer extends and exists by penetrating through said fourth layer, thereby being electrically and partially connected to said cathode electrode of said main thyristor.

9. A rectifier according to claim 8, wherein said control means comprises:
  a plurality of second-stage electrical trigger pilot thyristors each having emitter electrodes and gate electrodes to be electrically connected to the emitter electrode of said first-stage radiation trigger thyristor; and
  a plurality of final-stage electrical trigger pilot thyristors each having gate electrodes and emitter electrodes, said emitter electrodes being electrically connected to said collector electrode.

10. A rectifier according to claim 9, wherein the gate electrodes of said final-stage pilot thyristors are electrically connected to the emitter electrodes of said second-stage pilot thyristors, respectively.

11. A semiconductor device for controlling the transmission of electrical power, said device comprising:
  (a) a main thyristor having a plurality of semiconductor layers including four semiconductor layers respectively corresponding to a first emitter layer, first and second base layers and a second emitter layer, which layers are formed one upon another and are alternately of first and second conductivity types, said second base layer having a first surface region in which said second emitter layer is formed and an exposed second surface region; and
  (b) a plurality of stages of pilot thyristor sections which commonly have said first emitter layer and first and second base layers of said main thyristor, said plurality of stages of pilot thyristor sections including,
    a radiation trigger thyristor serving as a first stage of pilot thyristor section and having a closed loop shaped emitter layer which has the same conductivity type as said second emitter layer of said main thyristor and which is formed in the second surface region of said second base layer to define a gate region surrounded by said closed loop shaped emitter layer,
    at least one stage of an electrical trigger thyristor section having a closed loop shaped emitter layer which has the same conductivity type as said second emitter layer of said main thyristor and which is formed in the second surface region of said second base layer, said closed loop shaped emitter layer of said electrical trigger thyristor being non-concentric with respect to the emitter layer of said radiation trigger thyristor to define thereby a gate region surrounded by said closed loop shaped emitter layer of said electrical trigger thyristor section;
  (c) a collector electrode for collecting interference current generated at said plurality of stages of pilot thyristor sections, said collector electrode being formed on said second base layer so as to surround the emitter layers of said plurality of stages of pilot thyristor sections; and
  (d) conductive wiring means for serially connecting said plurality of stages of pilot thyristor sections such that when radiation is introduced to said radiation trigger thyristor, said plurality of stages of pilot thyristor sections are sequentially rendered conductive to generate a gate control current in response to which said main thyristor is turned on.

12. A device according to claim 11, wherein said plurality of stages of pilot thyristor sections comprises:
a plurality of stages of electrical trigger thyristors each having closed loop shaped emitter layers which are formed in the second surface region of said second base layer non-concentrically with respect to any one of said closed loop shaped emitter layers of said radiation trigger thyristor and said electrical trigger thyristors.

13. A device according to claim 12, wherein said conductive wiring means comprises:
first wire means for electrically connecting the emitter layer of said radiation trigger thyristor serving as the first-stage pilot thyristor both to the gate region of the electrical trigger thyristor serving as a second-stage pilot thyristor to be provided at the next stage of said radiation trigger thyristor and to the emitter layer of the electrical trigger thyristor serving as a final-stage pilot thyristor; and
second wire means for electrically connecting the emitter layer of said second-stage pilot thyristor to the gate region of the electrical trigger thyristor serving as a third-stage pilot thyristor to be provided at the next stage of said second-stage pilot thyristor.

14. A device according to claim 13, wherein said electrical trigger thyristor serving as the final-stage pilot thyristor has its emitter layer connected to said collector electrode.

15. A device according to claim 11, wherein said plurality of stages of pilot thyristor sections comprises:
a plurality of stages of electrical trigger thyristor sections each of which comprises a plurality of electrical trigger thyristors each having closed loop shaped emitter layers which are formed in the second surface region of said second base layer non-concentrically with respect to any one of said closed loop shaped emitter layers of said radiation trigger thyristor and said electrical trigger thyristors.

16. A device according to claim 15, wherein said conductive wiring means comprises:
first wire means for electrically connecting the emitter layer of said radiation trigger thyristor serving as the first-stage pilot thyristor both to the gate regions of the electrical trigger thyristors constituting a second-stage pilot thyristor section to be provided at the next stage of said radiation trigger thyristor; and
second wire means for electrically connecting the emitter layers of said electrical trigger thyristors constituting the second-stage pilot thyristor section to the gate regions of the electrical trigger thyristors constituting a third-stage pilot thyristor section to be provided at the next stage of said second-stage pilot thyristor section.

17. A device according to claim 16, wherein said electrical trigger thyristors serving as the final-stage pilot thyristor section have their emitter layers connected to said collector electrode.

* * * * *